(12) United States Patent
Huang et al.

(10) Patent No.: US 6,924,181 B2
(45) Date of Patent: Aug. 2, 2005

(54) STRAINED SILICON LAYER SEMICONDUCTOR PRODUCT EMPLOYING STRAINED INSULATOR LAYER

(75) Inventors: Chien-Chao Huang, Hsin-chu (TW); Chao-Hsiung Wang, Hsinchu (TW); Chung-Hu Ge, Hsin-Chu (TW); Wen-Chin Lee, Hsin-Chu (TW); Chen Ming Hu, Hsinchu (TW)

(73) Assignee: Taiwan SEmiconductor Manufacturing Co., Ltd, Hsin Chu (TW)

( * ) Notice: Subject to any disclaimer, the term of this patent is extended or adjusted under 35 U.S.C. 154(b) by 96 days.

(21) Appl. No.: 10/366,220

(22) Filed: Feb. 13, 2003

(65) Prior Publication Data

US 2004/0159834 A1 Aug. 19, 2004

(51) Int. Cl.[7] ............................................. H01L 21/336
(52) U.S. Cl. ....................... 438/197; 438/933; 257/347; 257/616
(58) Field of Search ................................. 257/347, 616; 438/197, 752, 933

(56) References Cited

U.S. PATENT DOCUMENTS

| | | | | |
|---|---|---|---|---|
| 5,534,713 A | | 7/1996 | Ismail et al. .................. 257/24 |
| 6,251,751 B1 | | 6/2001 | Chu et al. .................... 438/439 |
| 6,656,853 B2 | * | 12/2003 | Ito .............................. 438/778 |
| 6,690,043 B1 | * | 2/2004 | Usuda et al. ................ 257/194 |
| 6,730,551 B2 | * | 5/2004 | Lee et al. .................... 438/191 |
| 2002/0167048 A1 | * | 11/2002 | Tweet et al. ................. 257/347 |
| 2002/0168802 A1 | * | 11/2002 | Hsu et al. .................... 438/149 |
| 2003/0102490 A1 | * | 6/2003 | Kubo et al. .................. 257/192 |

* cited by examiner

*Primary Examiner*—Christian Wilson
(74) *Attorney, Agent, or Firm*—Tung & Associates

(57) ABSTRACT

A strained silicon layer fabrication and a method for fabrication thereof employ a strained insulator material layer formed over a strained silicon layer in turn formed upon a strained silicon-germanium alloy material layer which is formed upon a relaxed material substrate. The strained insulator material layer provides increased fabrication options which provide for enhanced fabrication efficiency when fabricating the strained silicon layer fabrication.

16 Claims, 1 Drawing Sheet

STRAINED SILICON LAYER SEMICONDUCTOR PRODUCT EMPLOYING STRAINED INSULATOR LAYER

BACKGROUND OF THE INVENTION

1. Field of the Invention

The present invention relates generally to strained silicon layer structures employed within semiconductor products. More particularly, the present invention relates to enhanced fabrication efficiency strained silicon layer structures employed within semiconductor products.

2. Description of the Related Art

As semiconductor product performance requirements have increased, so also have evolved novel semiconductor materials and structures which provide enhanced semiconductor product performance. Included among such novel materials and structures are strained silicon materials and structures which may be employed as substrates when forming semiconductor devices. Strained silicon materials and structures are desirable as semiconductor substrates insofar as strained silicon materials provide for enhanced carrier mobility and thus enhanced performance of semiconductor devices.

While strained silicon materials and structures are thus desirable in the semiconductor product fabrication art, they are nonetheless not entirely without problems. In that regard, it is often difficult in the semiconductor product fabrication art to efficiently fabricate strained silicon layer structures, insofar as strained silicon layer structures are often fabricated as multi-layer structures with specific laminated material layer requirements.

It is thus desirable in the semiconductor product fabrication art to provide strained silicon layer structures and methods for fabrication thereof, with enhanced fabrication efficiency.

It is towards the foregoing object that the present invention is directed.

Various strained silicon layer structures having desirable properties, and methods for fabrication thereof, have been disclosed in the semiconductor product fabrication art.

Included but not limiting among the strained silicon layer structures and methods, are strained silicon layer structures and methods disclosed within: (1) Ismail et al., in U.S. Pat. No. 5,534,713 (a strained silicon layer structure suitable for fabrication of complementary metal oxide semiconductor (CMOS) field effect transistor (FET) devices); and (2) Chu et al., in U.S. Pat. No. 6,251,751 (a method for forming a bulk and strained silicon on insulator structure by employing selectively oxidizable epitaxial material layers).

The teachings of each of the foregoing references are incorporated herein fully by reference.

Desirable in the semiconductor product fabrication art are additional strained silicon layer structures with enhanced fabrication efficiency.

It is towards the foregoing object that the present invention is directed.

SUMMARY OF THE INVENTION

A first object of the invention is to provide a strained silicon layer structure for use within a semiconductor product.

A second object of the invention is to provide a strained silicon layer structure in accord with the first object of the invention, wherein the strained silicon layer structure has enhanced fabrication efficiency.

In accord with the objects of the invention, the invention provides a strained silicon layer fabrication and a method for fabrication thereof.

In accord with the invention, the strained silicon layer fabrication comprises a relaxed material substrate. The strained silicon layer fabrication also comprises a strained silicon-germanium alloy material layer formed upon the relaxed material substrate. The strained silicon layer fabrication also comprises a strained silicon layer formed upon the strained silicon-germanium alloy material layer. Finally, the strained silicon layer fabrication also comprises a strained insulator material layer formed over the strained silicon layer.

The strained silicon layer fabrication of the present invention contemplates a method for fabricating the strained silicon layer fabrication of the invention.

The present invention provides a strained silicon layer structure for use within a semiconductor product, wherein the strained silicon layer structure has enhanced fabrication efficiency.

The present invention realizes the foregoing object by employing within a strained silicon layer structure within a strained silicon layer fabrication a strained insulator material layer formed over a strained silicon layer in turn formed upon a strained silicon-germanium alloy material layer in turn formed upon a relaxed material substrate. Within the invention, the strained insulator material layer provides additional fabrication options when fabricating the strained silicon layer structure within the strained silicon layer fabrication. Thus the strained silicon layer structure may be fabricated with enhanced fabrication efficiency.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a strained silicon layer structure for use within a semiconductor product, wherein the strained silicon layer structure has enhanced fabrication efficiency.

The present invention realizes the foregoing object by employing within a strained silicon layer structure within a strained silicon layer fabrication a strained insulator material layer formed over a strained silicon layer in turn formed upon a strained silicon-germanium alloy material layer which is formed upon a relaxed material substrate. Within the invention, the strained insulator material layer provides additional fabrication options when fabricating the strained silicon layer structure within the strained silicon layer fabrication. Thus the strained silicon layer structure may be fabricated with enhanced fabrication efficiency.

While the preferred embodiment of the invention illustrates the invention most specifically within the context of a field effect transistor device formed within a strained silicon layer fabrication, the invention is not intended to be so limited. Rather, the invention provides value under circumstances where any of several types of semiconductor devices may be formed within a strained silicon layer fabrication and thus derive benefit of enhanced performance due to the presence of a strained silicon layer within the strained silicon layer fabrication. Such semiconductor devices may include, but are not limited to resistors, transistors, capacitors, diodes and optoelectronic devices.

Figure 1:
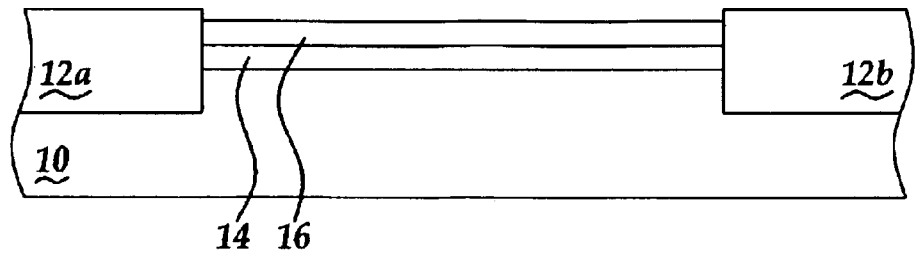
FIG. 1, FIG. 2 and FIG. 3 show a series of schematic cross-sectional diagrams illustrating the results of progressive stages in fabricating a strained silicon layer fabrication in accord with a preferred embodiment of the invention.
Figure 2:
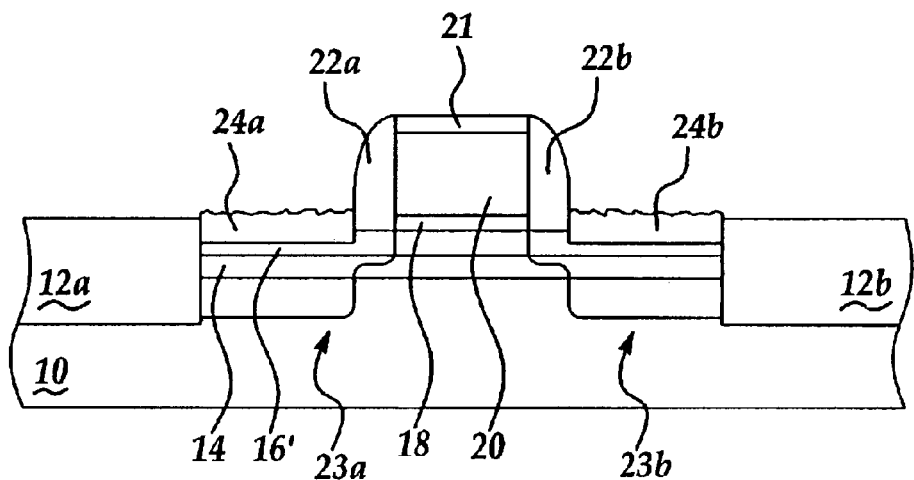
Figure 3:
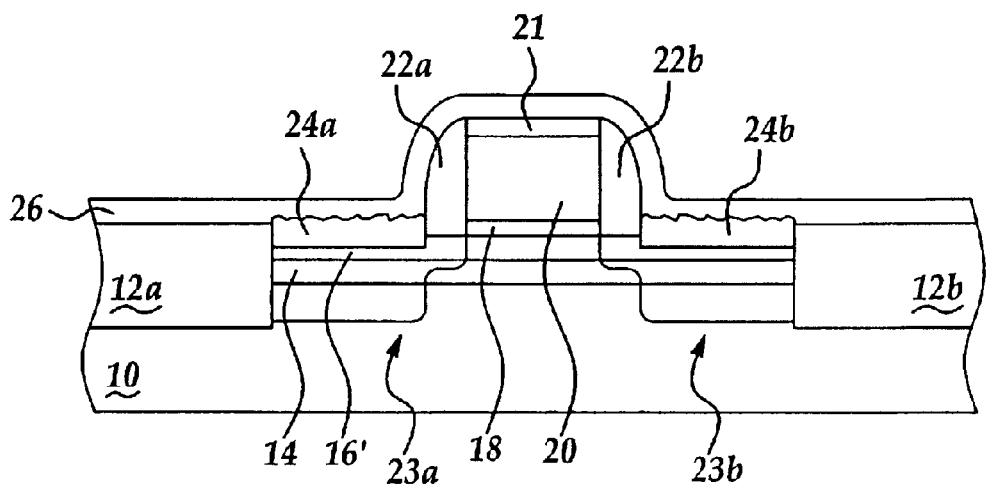

FIG. 1 to FIG. 3 show a series of schematic cross-sectional diagrams illustrating the results of progressive stages of fabricating a strained silicon layer fabrication in accord with a preferred embodiment of the invention.

FIG. 1 shows a schematic cross-sectional diagram of the strained silicon layer fabrication at an early stage in its fabrication in accord with the preferred embodiment of the invention.

FIG. 1 shows a relaxed substrate 10 having formed therein a pair of isolation regions 12a and 12b which define an active region of the relaxed substrate 10.

Within the invention, the relaxed substrate 10 may be formed of a material selected from the group including but not limited to relaxed insulator materials (as may more specifically be found within silicon-on-insulator (SOI) substrates) and relaxed semiconductor materials. Within the invention when the relaxed substrate 10 is formed of a relaxed semiconductor material, the relaxed substrate 10 may be formed from relaxed silicon semiconductor materials (which are generally preferred for forming N channel metal oxide semiconductor devices), relaxed silicon-germanium alloy semiconductor materials (which are generally preferred when forming P channel metal oxide semiconductor devices) and relaxed compound semiconductor materials (i.e., III–V and IV–VI) semiconductor materials) such as gallium arsenide semiconductor materials. More typically, the relaxed substrate 10 is formed of a relaxed silicon semiconductor material or a relaxed silicon-germanium alloy semiconductor material having either an N doping (for P channel devices), a P doping (for N channel devices) or separated regions of N doping and P doping (for complementary channel devices).

Within the invention, the pair of isolation regions 12a and 12b may be formed employing methods and materials as are conventional in the semiconductor product fabrication art, including but not limited to local oxidation of silicon (LOCOS) isolation methods and trench isolation methods. Typically, the pair of isolation regions 12a and 12b is formed as a pair of shallow trench isolation (STI) regions.

FIG. 1 also shows a strained silicon-germanium alloy material layer 14 formed upon the relaxed substrate 10. Finally, FIG. 1 also shows a strained silicon layer 16 formed upon the strained silicon-germanium alloy material layer 14.

Within the invention, the strained silicon-germanium alloy material layer 14 may be formed employing methods as are conventional in the semiconductor product fabrication art. Such methods are typically chemical vapor deposition (CVD) methods which employ variations in composition and deposition temperature such that the strained silicon-germanium alloy material layer 14 is formed with a tensile or compressive strain of from about 0.2 percent to about 5 percent to its relaxed form. Typically, the strained silicon-germanium alloy material layer 14 is formed with a germanium atomic concentration of from about 30 to about 40 atomic percent (i.e., $Si_xGe_{1-x}$ where 1-x equals 0.3 to 0.4), particularly under circumstances where the relaxed substrate 10 is a relaxed silicon-germanium alloy material substrate having a germanium atomic concentration of from about 20 to about 25 atomic percent. Typically, the strained silicon-germanium alloy material layer 14 is formed to a thickness of from about 20 to about 300 angstroms.

Within the invention, the strained silicon layer 16 is typically also formed employing a chemical vapor deposition method. The strained silicon layer 16 may be formed in-situ upon the strained silicon-germanium alloy material layer 14 by terminating a flow of a germanium source material within a single chemical vapor deposition method. Typically, the strained silicon layer 16 is also formed with a tensile or compressive strain, in a range of from about 0.2 percent to about 5 percent to its relaxed form, and also formed to a thickness of from about 50 to about 1200 angstroms.

FIG. 2 shows the results of further processing of the strained silicon layer fabrication of FIG. 1.

FIG. 2 shows a field effect transistor device formed within and over the active region of the relaxed substrate 10. The field effect transistor device comprises: (1) a gate dielectric layer 18 formed upon a partially consumed strained silicon layer 16' derived from the strained silicon layer 16; (2) a gate electrode 20 formed aligned upon the gate dielectric layer 18; (3) a gate electrode capping layer 21 formed aligned upon the gate electrode 20; (4) a pair of spacer layers 22a and 22b formed adjoining a pair of opposite sidewalls of the gate dielectric layer 18, the gate electrode 20 and the gate electrode capping layer 21; (5) a pair of source/drain regions formed into the partially consumed strained silicon layer 16', the strained silicon-germanium alloy material layer 14 and the relaxed substrate 10 (when formed of a relaxed semiconductor material rather than a relaxed insulator material) at areas not covered by the gate electrode capping layer 21, the gate electrode 20 and the gate dielectric layer 18; and (6) a pair of metal silicide layers 24a and 24b formed upon exposed portions of the source/drain regions 23a and 23b. While FIG. 2 illustrates the pair of metal silicide layers 24a and 24b as formed only partially vertically consuming the strained silicon layer 16, given appropriate thicknesses of the strained silicon layer 16, the strained silicon-germanium alloy material layer 14 and a metal silicide forming metal layer not otherwise illustrated, the pair of metal silicide layers 24a and 24b may penetrated completely vertically through the strained silicon layer 16 and the strained silicon-germanium alloy material layer 14. In addition, within the context of additional considerations and limitations as are discussed in further detail below, each of the foregoing structures which comprises the field effect transistor device may be formed employing methods and materials as are generally conventional in the semiconductor product fabrication art.

For example and without limitation, the gate dielectric layer 18 is typically formed at least in part of a silicon oxide material formed to a thickness of from about 8 to about 70 angstroms. In addition and without limitation, the gate electrode 20 is typically formed at least in part of a doped polysilicon or polycide (doped polysilicon/metal silicide stack) gate electrode material formed to a thickness of from about 600 to about 2500 angstroms. Further and without limitation, the gate electrode capping layer 21 is typically formed of a silicon oxide material formed to a thickness of from about 100 to about 800 angstroms. Yet further and without limitation, the pair of spacer layers 22a and 22b is typically formed of a silicon nitride material which is shaped while employing an anisotropic etching method. Still yet further and without limitation, the pair of source/drain regions 23a and 23b is typically formed employing a two step ion implantation method with the sequential presence and absence of the pair of spacer layers 22a and 22b. Finally and without limitation, the pair of metal silicide layers 24a and 24b is typically formed employing a thermal annealing salicide silicide formation method employing metals such as but not limited to titanium, cobalt, nickel and vanadium.

FIG. 3 shows the results of further processing of the strained silicon layer fabrication of FIG. 2.

FIG. 3 shows a strained insulator material layer 26 formed upon exposed portions of the pair of isolation regions 12a and 12b, the pair of metal silicide layers 24a and 24b, the pair of spacer layers 22a and 22b and the gate electrode capping layer 21.

Within the invention, the strained insulator material layer 26 is typically formed of a silicon nitride material and formed to a thickness of from about 150 to about 1000 angstroms. Typically, the strained insulator layer 26 is formed with a tensile or compressive stress of from about 1E9 to about 2E10. The strained insulator material layer 26 may be employed as an etch stop layer for a pre-metal dielectric (PMD) layer formed thereupon when forming a via through the pre-metal dielectric layer to reach the gate electrode 20 or the pair of source/drain regions 24a and 24b.

Within the invention, the strained insulator material layer 26 assists in providing and reinforcing strain within the partially consumed strained silicon layer 16' such that the field effect transistor device as illustrated within FIG. 3 operates with enhanced performance. Thus, the strained insulator material layer 26 provides enhanced fabrication options when fabricating the strained silicon layer fabrication of FIG. 3.

As is understood by a person skilled in the art, various of the other components within the field effect transistor device as illustrated in FIG. 3 may also be fabricated with strain levels engineered to assist in providing an optimal strain level within the partially consumed strained silicon layer 16'. For example, portions of the gate dielectric layer 18 and either or both of the pair of spacer layers 22a and 22b may also be formed with a tensile strain. In addition, either or both of the pair of metal silicide layers 24a and 24b may also be formed with a compressive strain such as to offset and compensate the tensile strain of the strained insulator layer 26 in locations other than over the channel region of the field effect transistor device.

As is further understood by a person skilled in the art, the preferred embodiment of the invention is illustrative of the invention rather than limiting of the invention. Revisions and modifications may be made to methods, materials, structures and dimensions in accord with the preferred embodiment of the invention while still providing embodiments in accord with the present invention, further in accord with the accompanying claims.

What is claimed is:

1. A strained silicon layer structure comprising:
   a relaxed material substrate;
   a strained silicon-germanium alloy material layer formed upon the relaxed material substrate;
   a strained silicon layer formed upon the strained silicon-germanium alloy material layer, wherein at least one of the strained silicon-germanium alloy material layer and the strained silicon layer is formed with a compressive strain;
   a P channel device formed on the strained silicon layer or the strained silicon-germanium alloy material layer; and
   a tensile strained insulator material layer formed over the P channel device.

2. The strained silicon layer structure of claim 1 wherein the relaxed material substrate is formed of a relaxed insulator material employed within a silicon-on-insulator semiconductor product.

3. The strained silicon layer structure of claim 1 wherein the relaxed material substrate is formed from a relaxed semiconductor material selected from the group consisting of relaxed silicon semiconductor materials and relaxed silicon-germanium alloy semiconductor materials.

4. The strained silicon layer structure of claim 1 wherein the strained silicon-germanium alloy material layer is formed to a thickness of from about 50 to about 300 angstroms.

5. The strained silicon layer structure of claim 1 wherein the strained silicon layer is formed to a thickness of from about 50 to about 1000 angstroms.

6. The strained silicon layer structure of claim 1 wherein the tensile strained insulator material layer is formed to a thickness of from about 150 to about 700 angstroms.

7. A method for fabricating a strained silicon layer structure comprising:
   providing a relaxed material substrate;
   forming a strained silicon-germanium alloy material layer upon the relaxed material substrate;
   forming a strained silicon layer upon the strained silicon-germanium alloy material layer, wherein at least one of the strained silicon-germanium alloy material layer and the strained silicon layer is formed with a compressive strain;
   forming a P channel device on the strained silicon layer or the strained silicon-germanium alloy material layer; and
   forming a tensile strained insulator material layer over the P channel device.

8. The method of claim 7 wherein the relaxed material substrate is formed of a relaxed insulator material employed within a silicon-on-insulator semiconductor product.

9. The method of claim 7 wherein the relaxed material substrate is formed from a relaxed semiconductor material selected from the group consisting of relaxed silicon semiconductor materials and relaxed silicon-germanium alloy semiconductor materials.

10. The method of claim 7 wherein the strained silicon-germanium alloy material layer is formed to a thickness of from about 50 to about 300 angstroms.

11. The method of claim 7 wherein the strained silicon layer is formed to a thickness of from about 50 to about 1000 angstroms.

12. The method of claim 7 wherein the tensile strained insulator layer is formed to a thickness of from about 150 to about 700 angstroms.

13. A strained silicon layer structure comprising:
   a relaxed material substrate;
   a strained silicon-germanium alloy material layer formed upon the relaxed material substrate;
   a strained silicon layer formed upon the strained silicon-germanium alloy material layer, wherein at least one of the strained silicon-germanium alloy material layer and the strained silicon layer is formed with a compressive strain;
   a P channel device formed on the strained silicon layer or the strained silicon-germanium alloy material layer; and
   a compressive strained insulator material layer formed over the P channel device.

14. A strained silicon layer structure comprising:

a relaxed material substrate;

a strained silicon-germanium alloy material layer formed upon the relaxed material substrate;

a strained silicon layer formed upon the strained silicon-germanium alloy material layer, wherein at least one of the strained silicon-germanium alloy material layer and the strained silicon layer is formed with a tensile strain;

a P channel device formed on the strained silicon layer or the strained silicon-germanium alloy material layer; and a compressive strained insulator material layer formed over the P channel device.

15. A method for fabricating a strained silicon layer fabrication comprising:

providing a relaxed material substrate;

forming a strained silicon-germanium alloy material layer upon the relaxed material substrate;

forming a strained silicon layer upon the strained silicon-germanium alloy material layer, wherein at least one of the strained silicon-germanium alloy material layer and the strained silicon layer is formed with a compressive strain;

forming a P channel device on the strained silicon layer or the strained silicon-germanium alloy material layer; and forming a compressive strained insulator material layer over the P channel device.

16. A method for fabricating a strained silicon layer fabrication comprising:

providing a relaxed material substrate;

forming a strained silicon-germanium alloy material layer upon the relaxed material substrate;

forming a strained silicon layer upon the strained silicon-germanium alloy material layer, wherein at least one of the strained silicon-germanium alloy material layer and the strained silicon layer is formed with a tensile strain;

forming a P channel device on the strained silicon layer or the strained silicon-germanium alloy material layer; and forming a compressive strained insulator material layer over the P channel device.

\* \* \* \* \*